United States Patent
Fukuda

(10) Patent No.: US 6,281,693 B1
(45) Date of Patent: *Aug. 28, 2001

(54) SEMICONDUCTOR DEVICE TEST BOARD AND A METHOD OF TESTING A SEMICONDUCTOR DEVICE

(75) Inventor: Jun Fukuda, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/088,709

(22) Filed: Jun. 2, 1998

(30) Foreign Application Priority Data

Sep. 1, 1997 (JP) .................................................. 9-236032

(51) Int. Cl.$^7$ ...................................................... G01R 1/06
(52) U.S. Cl. ............................................. 324/757; 324/754
(58) Field of Search .................................... 324/754, 757, 324/158.1, 765

(56) References Cited

U.S. PATENT DOCUMENTS

| | | | | |
|---|---|---|---|---|
| 5,096,449 | * | 3/1992 | Matsuzaki | 445/36 |
| 5,374,893 | * | 12/1994 | Koopman et al. | 324/754 |
| 5,914,614 | * | 6/1999 | Beaman et al. | 324/754 |
| 5,974,662 | * | 11/1999 | Eldridge et al. | 324/754 |
| 5,977,783 | * | 11/1999 | Takayama et al. | 324/754 |
| 6,015,325 | * | 1/2000 | Inazuru et al. | 445/28 |
| 6,097,087 | * | 8/2000 | Farnworth et al. | 257/698 |

* cited by examiner

Primary Examiner—Ernest Karlsen
(74) Attorney, Agent, or Firm—Armstrong, Westerman, Hattori, McLeland & Naughton, LLP

(57) ABSTRACT

A semiconductor device test board for performing a test on a semiconductor device includes a supporting board formed of an insulating material and contact parts which are formed on the supporting board, and which can be connected to solder bumps formed on a semiconductor device to be tested. Each of the contact parts includes contact base layers formed of conductive materials other than solder and a solder layer having a thin-film shape, and covering the contact base layers.

5 Claims, 5 Drawing Sheets

SEMICONDUCTOR DEVICE TEST BOARD AND A METHOD OF TESTING A SEMICONDUCTOR DEVICE

BACKGROUND OF THE INVENTION

1. Field of the Invention

The present invention generally relates to a semiconductor device test board and a method for testing a semiconductor device, and more particularly relates to a semiconductor device test board and a method for testing a semiconductor device used for testing a semiconductor device having solder bumps.

2. Description of the Related Art

Recently, semiconductor devices have achieved higher density, higher speed and a multi-pin structure. Along with the above improvements, semiconductor devices using solder bumps as external connection terminals came into use.

The above described semiconductor device is subjected to various tests such as a burn-in test with the solder bumps connected to a semiconductor device test board. Accordingly, to provide a semiconductor device with high reliability, there is a need for a positive connection between the semiconductor device and the semiconductor device test board. Also, when removing the semiconductor device from the test board, it is required not to damage the solder bumps.

FIGS. 1–3 show a semiconductor device test board and a method for testing a semiconductor device according to the related art.

A semiconductor device test board 10A, shown in FIG. 1, includes a supporting board 12 made of an insulating material such as glass or ceramics, a metal pattern 14 formed on the supporting board 12, contact parts 20A, and an insulating layer 22. The contact parts 20A will be connected to solder bumps 18 provided on a semiconductor device 16 to be tested. The insulating layer 22 is provided on the metal pattern 14 avoiding locations where the contact parts 20A are formed.

The contact parts 20A are provided at openings formed on the insulating layer 22. Each contact part 20A is formed of an upper layer 26 and a lower layer 24. In the related art, the lower layer 24 is formed of nickel (Ni), and the upper layer 26 formed of gold (Au).

Accordingly, as shown in FIG. 1, when the semiconductor device 16 is mounted on the semiconductor device test board 10A, the solder bumps 18 are connected by fusion on the upper layers 26 of the contact parts 20A. Predetermined reliability tests such as a burn-in test are carried out in such a connected state.

Generally, copper (Cu) is used for forming a wiring pattern of the board. Accordingly, the lower layer 24 is formed of nickel in order to provide an improved adhesiveness with copper (Cu) and to act as a barrier to gold forming the upper layer 26. Also, the upper layer 26 is formed of gold (Au) in order to provide an improved adhesiveness with the solder bump 18 and to prevent an oxidization of a surface of the nickel layer 24.

In the following, the solder bumps 18 on the semiconductor device 16 will be described in detail. There are two types of solder bumps. One is a solder bump 18 which acts as an input/output for signals and electrical power when testing the semiconductor device (in the following, referred to as a testing solder bump 18a). The other type is a solder bump 18 which is not used when testing the semiconductor device (in the following, referred to as a non-testing solder bump 18b).

The testing solder bump 18a is connected to the contact part 20A as described above, whereas there is no contact part 20A formed at the position of the non-testing solder bump. Therefore, when testing the semiconductor device, the non-testing solder bump directly touches the insulating layer 22.

FIGS. 2 and 3 show an example of a semiconductor device test board 10B which uses a dome-shaped solder pad 28 as a contact part 20B. In FIGS. 2 and 3, the same elements as those of the semiconductor device test board 10A of FIG. 1 are shown with the same reference numbers.

When the semiconductor device test board 10B is used, the semiconductor device 16 is mounted on the semiconductor device test board 10B by direct fusion connection of the solder pad 28 to the solder bump 18 provided on the semiconductor device 16. In this connected state, predetermined reliability tests such as the burn-in test are carried out.

However, when the semiconductor device test board 10A is used (see FIG. 1), there is a problem that the solder bump 18 is degraded by a heating process carried out during the test, thereby decreasing the reliability of the semiconductor device 16. This will be described in detail later.

When the semiconductor device test board 10A shown in FIG. 1 is used, the solder bumps 18 are connected to the upper layer 26 formed of gold (Au). Because of the heat history of the heating process carried out in the testing step, a gold-tin (Au—Sn) alloy is formed. During the re-forming of the solder bumps 18 caused by a re-flow step which is performed after the testing step, the Au—Sn alloy is mixed into the solder bumps 18. Therefore, there was a problem of a degradation of the solder bumps and a decrease in the reliability of the semiconductor device 16.

In the case of the semiconductor device test board 10B shown in FIGS. 2 and 3, when the semiconductor device 16 is mounted on the semiconductor device test board 10B and the solder bump 18 is connected with the solder pad 28, the solder forming this solder pad 28 escapes or protrudes from the side (see the central part of FIG. 2). In the following, this solder is referred to as escape solder 29.

As shown in FIG. 2, when the solder escapes, the escape solder 29 will be placed on top of the insulating layer 22. This prevents the solder bump 18 and the metal pattern 14 from being electrically connected. Therefore there is a problem that a proper test of the semiconductor device 16 cannot be carried out.

Also, both the solder bump 18 and the solder pad 28 have considerably good bonding ability since they are formed of solder. Therefore, their bonding strength will be stronger when they are connected by fusion. Accordingly, when removing the semiconductor device 16 from the semiconductor device test board 10B after the test, there may be a case that the bonding strength of the solder bump 18 is greater against the semiconductor device test board 10B than against the semiconductor device 16.

In the above case, as shown in FIG. 3, the solder bump 18 may peel off from the semiconductor device 16 and remain on the semiconductor device test board 10B (the solder bump shown on the left part of FIG. 3). This created a problem that the semiconductor device 16 may be damaged by performing a test thereon.

Also, in the related art, the non-testing solder bump 18b directly touches the insulating layer 22 during the test. Therefore, when the semiconductor device 16 is mounted on the semiconductor device test board 10A, 10B, the distance between the semiconductor device 16 and the semiconductor device test board 10A, 10B is limited by the height of the non-testing solder bump 18b. This causes a problem that the testing solder bump 18a and the contact part 20A, 20B will not connect easily (referred to as a spring-back phenomenon).

Further, in the related art, the supporting board 12 is formed of glass and ceramics, which are relatively expensive. This leads to a problem of high production cost of the semiconductor device test board 10A, 10B. In order to reduce the cost of the semiconductor device test board 10A, 10B, a glass/epoxy board is preferably used as a supporting board 12. However, the glass/epoxy board may not be used in the related art because of its greater thermal expansion compared to that of a board made of either glass or ceramics. This causes a greater amount of the escape solder 29 shown in FIGS. 2 and 3 to be produced. Therefore there is a problem in that the glass/epoxy board may not be used.

SUMMARY OF THE INVENTION

Accordingly, it is a general object of the present invention to provide a semiconductor device test board and a method of testing a semiconductor device, which can solve the above problems.

It is another and more specific object of the present invention to provide a semiconductor device test board and a method of testing a semiconductor device which can provide an ability to carry out reliable tests and provide a high reliability of the semiconductor device.

It is still another object according to the present invention to provide a semiconductor device test board and a method of testing a semiconductor device, which can provide a positive electrical connection between solder bumps and contact parts and which can prevent degradation of the solder bumps.

In order to achieve the above object according to the present invention, a semiconductor device test board for performing a test on a semiconductor device includes:

a supporting board formed of an insulating material; and contact parts which are formed on the supporting board, and can be connected to solder bumps formed on a semiconductor device to be tested, each of the contact parts includes:

contact base layers formed of conductive materials other than solder; and a solder layer having a thin-film shape, and covering the contact base layers.

Also, in order to achieve the above object according to the present invention, a method of testing a semiconductor device includes the steps of:

a) mounting the semiconductor device on a semiconductor device test board by fusion connection of solder bumps provided on said semiconductor device to a solder layer of contact parts of said semiconductor device test board, said contact parts including contact base layers formed of conductive materials other than solder, said solder layers having a thin-film shape and covering the contact base layers;

b) performing a predetermined electrically driven test on the semiconductor device using the semiconductor device test board; and c) removing, after the step b), the semiconductor device from the semiconductor device test board by separating the solder bumps from the contact parts.

In the semiconductor device test board and the method described above, the solder bumps of the semiconductor device are connected to the contact parts when the semiconductor device is mounted on the semiconductor device test board (herein after referred to as mounted state). The contact parts include contact base layers formed of conductive materials other than solder and a solder layer of a thin-film shape covering the contact base layers. Therefore, the solder bumps are connected by fusion to the solder layer.

The solder bumps and the contact parts may be positively electrically connected since, as has been described, the solder layer has a thin-film shape, so that the solder layer does not escape to the side of the contact parts when the solder bumps are connected.

Also, when the semiconductor device is mounted, the semiconductor device and the semiconductor device test board are simply connected by a joining force between the solder bumps and the solder layer. Therefore, the semiconductor device may easily be removed from the semiconductor device test board after the test, and the solder bumps will not remain on the semiconductor device test board. Further, in the removing step, the contact base layers will not be mixed into the solder bumps and degradation of the solder bumps will not occur.

It is yet another object according to the present invention to provide a semiconductor device test board and a method of testing a semiconductor device, which can reduce the cost of the semiconductor device test board while maintaining a positive connection between the solder bumps and the contact parts.

In order to achieve the above object, the supporting board is a glass/epoxy wiring board. Also, the solder layer has a thickness of 5–20 $\mu$m.

In the semiconductor device test board described above, the cost is reduced using a glass/epoxy wiring board as a supporting board. Since the glass/epoxy wiring board has a high thermal expansion rate, when a structure of the test board is the same as that of the related art, the solder may escape to the side when mounting the semiconductor device. However, in the present invention, the contact part includes contact materials and a solder layer having a thin-film shape. Accordingly, the solder layer will not escape to the side and a positive electrical connection between the solder bumps and the contact part is achieved.

In is yet another object according to the present invention to provide a positive connection between the solder bumps used while a test is being performed and the contact parts.

In order to achieve the above object according to the invention, the semiconductor device test board further includes, at a predetermined position for a solder bump which is provided on the semiconductor device and is not used in the test, a solder resist part which has a recessed shape into which the solder bump can be inserted In the semiconductor device test board described above, a solder resist part has a recessed shape not provided with the contact base layers and/or the solder layer, and is formed at positions where at least one of the non-testing bumps are to be formed, said at least one of the non-testing bumps being provided on said semiconductor device and does not carry out any test. Therefore, the non-testing solder bumps are inserted within the solder resist parts. Thus the distance between the semiconductor device and the semiconductor device board is not limited by the non-testing bumps. Accordingly, the occurrence of a spring-back phenomenon is inhibited and the solder bumps used for performing a test and the contact parts are positively connected.

Other objects and further feature of the present invention will be apparent from the following detailed description when read in conjunction with the accompanying drawings.

DETAILED DESCRIPTION OF THE PREFERRED EMBODIMENTS

In the following, a principle and an embodiment of the present invention will be described with reference to the accompanying drawings.

Figure 1:
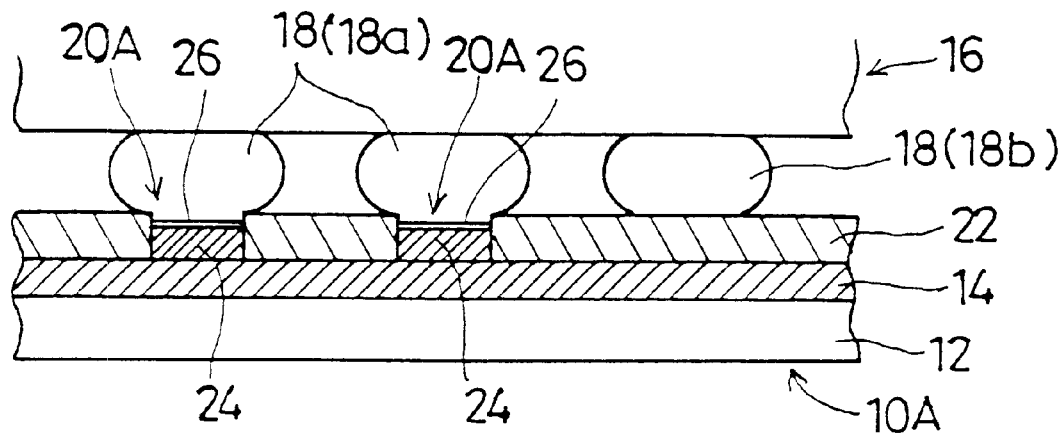
FIG. 1 is a cross-sectional diagram showing an example of a semiconductor device test board of the related art.
Figure 2:
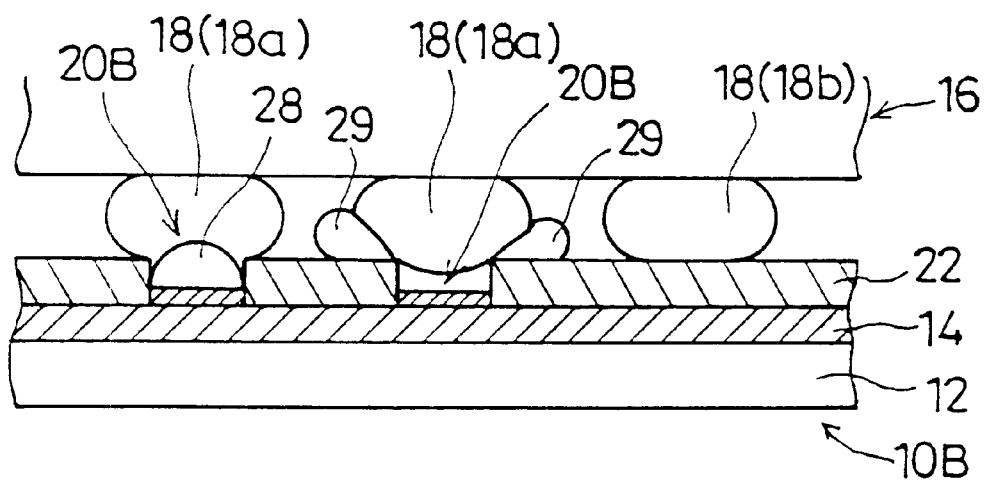
FIG. 2 is a cross-sectional diagram showing an example of a semiconductor device test board of the related art.
Figure 3:
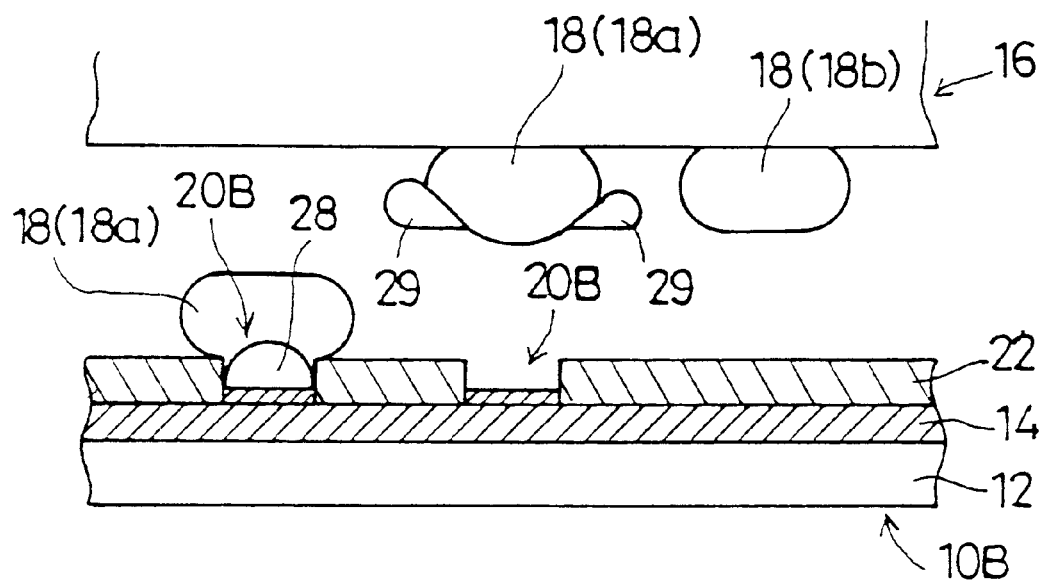
FIG. 3 is a cross-sectional diagram showing an example of a semiconductor device test board of the related art.
Figure 4:
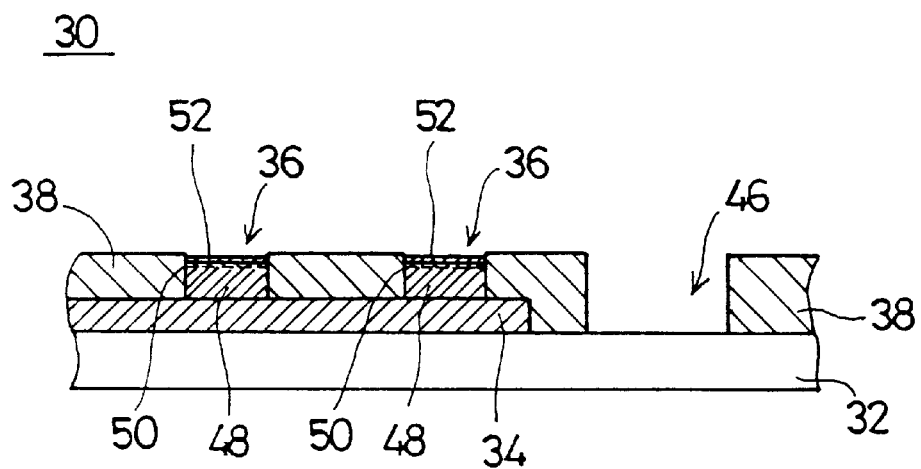
FIG. 4 is a cross-sectional diagram showing an embodiment of a semiconductor device test board of the related art.

FIG. 4 shows a semiconductor device test board 30, which is an embodiment of the present invention. In general, the semiconductor device test board 30 includes a supporting board 32, a metal pattern 34, contact parts 36 and an insulating layer 38.

Figure 6:
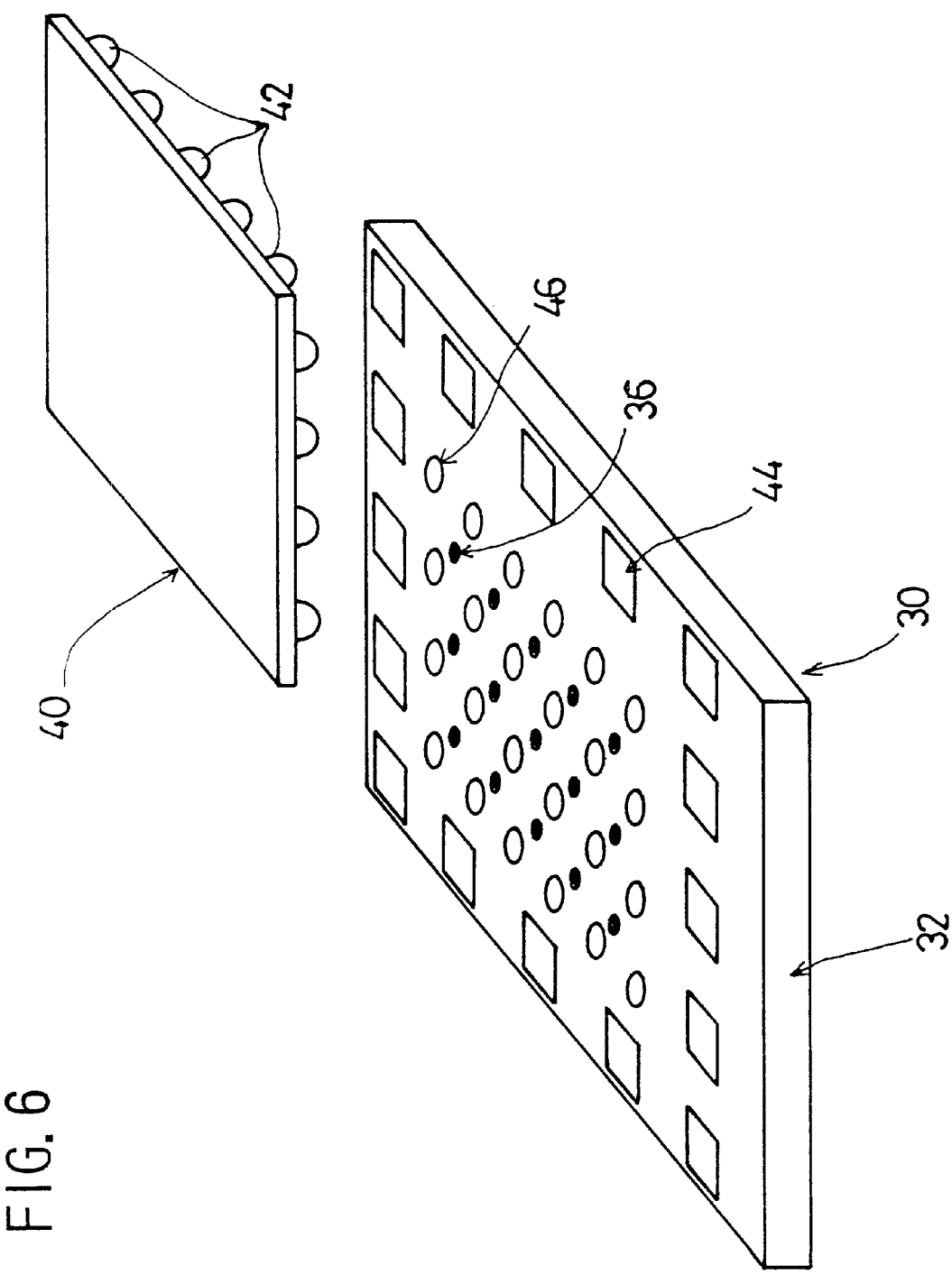
FIG. 6 is a perspective diagram showing a mounting process of a semiconductor device onto a semiconductor device test board according to the present invention.

As shown in FIG. 6, this semiconductor device test board 30 is used for carrying out reliability tests such as a burn-in test on a semiconductor device 40 with the semiconductor device 40 to be tested mounted thereon. Also, the semiconductor device test board 30 according to the present invention performs a test on the semiconductor device 40 provided with solder bumps 42 which are used as external connection electrodes.

The supporting board 32 is formed of an insulating material, which is a glass/epoxy wiring board in the present embodiment. The supporting board 32 is a glass/epoxy wiring board, which is cheap compared to the prior glass board and ceramic board. Therefore, the cost of the semiconductor device test board 30 may be reduced.

Contact parts 36, a metal pattern 34 and test pads 44 (see FIG. 6) are provided on the surface of the supporting board 32. As will be described, the solder bumps 42 of the semiconductor device 40 will be connected to the contact parts 36. The metal pattern 34 is for example formed by printing a copper (Cu) layer on the supporting board 32 with the predetermined wiring pattern. The test pads 44 are provided on the peripheral part of the supporting board 32, and a probe of a testing device such as a tester is connected thereto during the test.

The contact parts 36 and the test pads 44 are electrically connected to the metal pattern 34. When the semiconductor device 40 is mounted on the semiconductor device test board 30, the probe of the tester may be connected to the test pads 44. Then, the tester is connected to the solder bumps 42 via the metal pattern 34 and the contact parts 36. Thereby, it is possible to perform an electrical test using the tester, even with the semiconductor device 40 having solder bumps 42 (external connection terminals) mainly at the bottom.

Further, the supporting board 32 is provided with the insulating layer 38, which serves as a protection layer. This insulating layer 38 is for example a resin of the polyimid type, which covers the whole surface of the supporting board 32. At a predetermined position of the insulating layer 38, there are formed an opening for the contact part 36, an opening for the test pad 44 and a solder resist part 46, which will be described later.

The solder resist part 46 is an opening formed through the insulating layer 38 so that the supporting board 32 is exposed. As will be described later, the solder resist part 46 is formed at a position corresponding to the solder bump 42 on the semiconductor device 40, which is not used during the test (in the following, referred to as a non-testing solder bump 42b).

Figure 5:
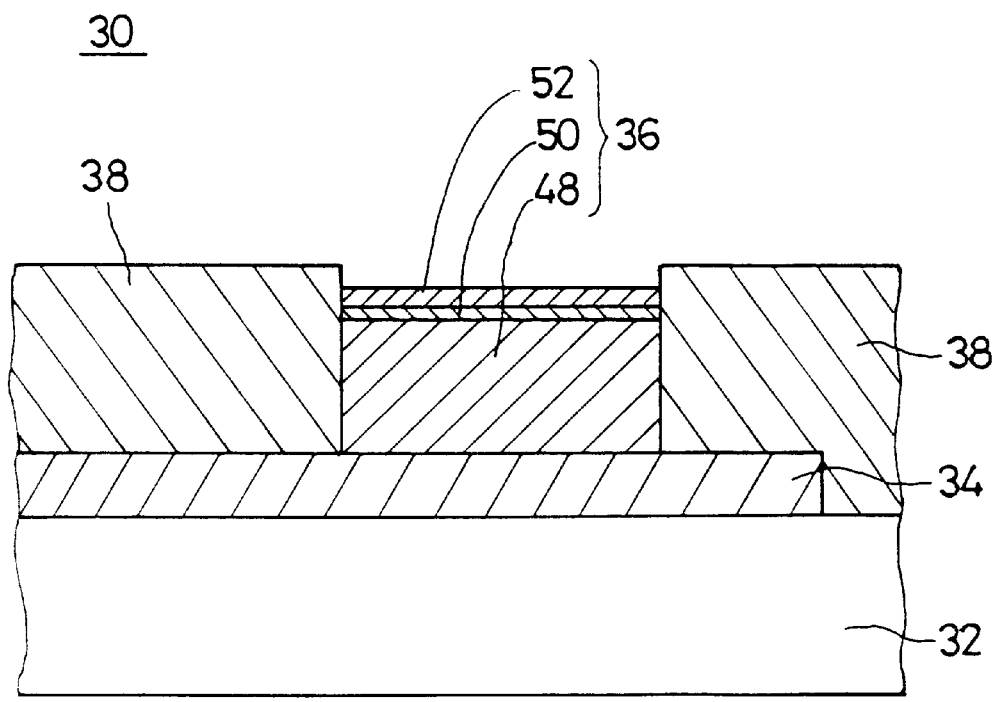
FIG. 5 is an enlarged detailed diagram showing an embodiment of a semiconductor device test board of the related art.

Now, referring to FIGS. 4 and 5, the structure of the contact part 36 will be described. FIG. 5 is an enlarged diagram of the position for providing the contact part 36.

As has been described, the contact part 36 is provided at the opening formed on the insulating layer 38. The contact part 36 has a triple layered structure with a nickel (Ni) layer 48 at the bottom, a gold (Au) layer 50 in the middle, and a solder layer 52 at the top. The nickel layer 48 is comparatively thick with a thickness of, for example 5–10 μm. The gold layer 50 is thinner compared to the nickel layer 48 and has a thickness of for example 0.1–1.0 μm.

The solder layer 52 forms an important feature of the present invention. The solder layer 52 has a thickness of for example 5–20 μm and has a thin-film shape. Also, the conductor size of the solder layer 52 is not to exceed 80 μm. The solder layer 52 is formed on the upper surface of the gold layer 50 by plating or solder dipping so as to form a smooth surface.

The contact parts 36 of the above structure are formed at a position corresponding to the solder bump 42 provided on the semiconductor device 40, which is used during the test (in the following, referred to as a testing solder bump 42a).

Now a method for testing a semiconductor device will be described, which is performed on the semiconductor device 40 using the semiconductor device test board 30 of the above structure.

Figure 7:
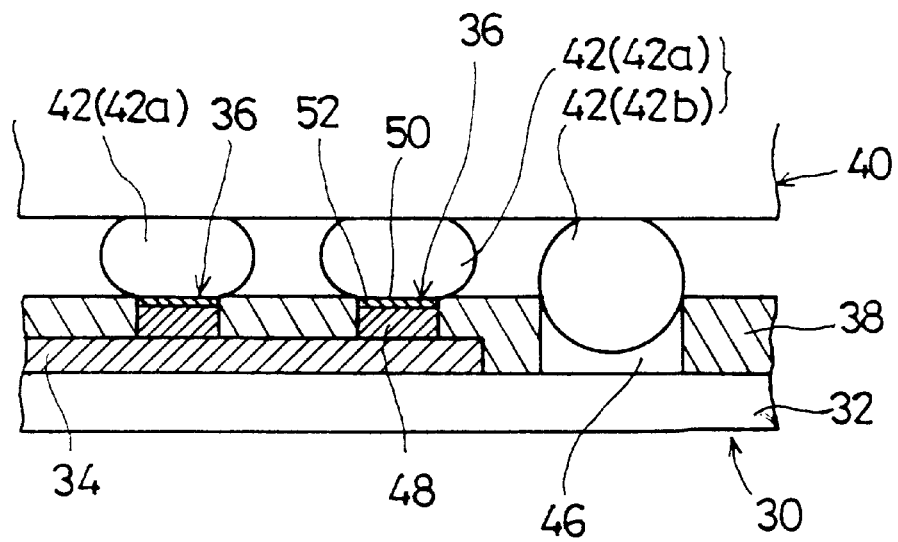
FIG. 7 is a cross-sectional diagram showing a mounting process and a test process of a test using a semiconductor device test board according to the present invention.

First of all, a mounting step is performed for mounting the semiconductor device 40 on the semiconductor device test board 30. In this mounting step, as shown in FIG. 6, the semiconductor device 40 is mounted on the semiconductor device test board 30 such that the semiconductor device 40 and the semiconductor device test board 30 are opposed. Mounting is performed after positioning the testing solder bumps 42a provided on the semiconductor device at the contact parts 36 and the non-testing solder bumps 42b at the solder resist part 46. Then, by fusion connection of the solder bumps 42 formed on the semiconductor device 40 to the solder layer 52 provided at the contact parts 36, the semiconductor device 40 is fixed with the semiconductor device test board 30. FIG. 7 shows the semiconductor device 40 which is mounted on the semiconductor device test board 30.

When the semiconductor device 40 is mounted as described above, the testing solder bumps 42a of the semiconductor device 40 are electrically connected to the contact parts 36. The contact parts 36 are formed of the nickel layer 48 and of the gold layer 50 (contact base layers) which are conductive materials other than solder, and also formed of the solder layer 52 of the thin-film shape provided so as to cover the contact base layers. Therefore, the testing solder bumps 42a are connected by fusion to the solder layer 52.

Since the solder layer 52 has a thin-film shape, it does not escape to the side of the forming position or the contact part 36. Thereby, an electrical connection between the testing solder bumps 42a and the contact parts 36 is positively performed and a test with high reliability may be carried out.

Also, as described above, there are two types of solder bumps 42 provided on the semiconductor device 40. One is the testing solder bump 42a acting as an input/output of the signals and electrical power during the test, and the other is a non-testing solder bump 42b which is not used during the test. Further, the non-testing solder bumps 42b which are not used during testing are, when the semiconductor device is mounted as shown in FIG. 7, inserted in the solder resist parts 46 each having a recessed-shape.

Thus, the non-testing solder bumps 42b do not limit the distance between the semiconductor device 40 and the semiconductor device test board 30. This inhibits the occurrence of the so-called spring-back phenomenon. Accordingly, the testing solder bumps 42a and the contact parts 36 are positively electrically connected and a test with high reliability may be performed.

When the semiconductor device is mounted as shown in FIG. 7, a probe of a tester is connected to the test pads 44 formed on the semiconductor device test board 30, and predetermined reliability tests such as a burn-in test are performed (testing step). During the testing step, a heating process is performed. However, because the testing solder bumps 42a are connected to the solder layer 52, a gold-tin (Au—Sn) alloy will not be formed at a boundary surface of the testing solder bumps 42a and the contact parts 36. Accordingly, there will be no degradation or characteristic change of the testing bumps 42a.

Figure 8:
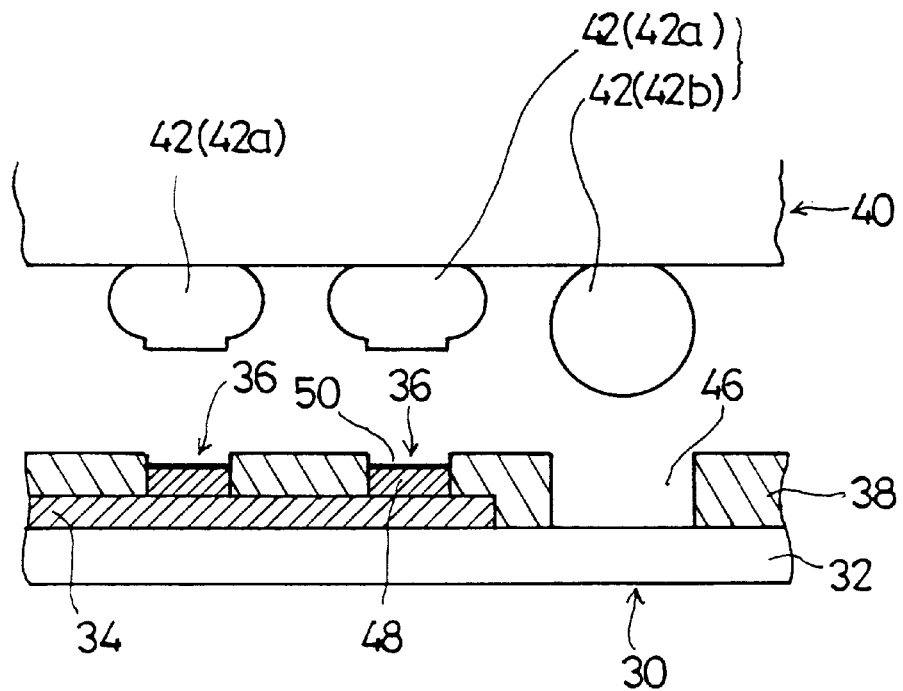
FIG. 8 is a cross-sectional diagram showing a remove process of a test using a semiconductor device test board according to the present invention.

After the testing step, a removing step is performed. In the removing step, the semiconductor device 40 is removed from the semiconductor device test board 30 by separating the testing solder bumps 42a from the contact parts 36. FIG. 8 shows the removing step.

This removing step is performed by separating the semiconductor device 40 from the semiconductor device test board 30. In the mounted state described above, the connection between the semiconductor device 40 and the semiconductor device test board 30 is maintained simply by the bonding force between the testing solder bumps 42a and the solder layer 52.

Therefore, the semiconductor device 40 is easily removed from the semiconductor device test board 30 after the test, and the testing solder bumps 42a will not remain on the semiconductor device test board 30. Also, gold (a contact base layer) does not mix into the testing solder bumps 42 upon removing, and the testing solder bumps 42a will not be degraded.

Note that in the present invention, any semiconductor device using solder bumps as external terminals, such as a semiconductor device of the BGA type or bare chips, may be employed.

Further, the present invention is not limited to these embodiments, but variations and modifications may be made without departing from the scope of the present invention.

What is claimed is:

1. A semiconductor device test board for performing a test on a semiconductor device comprising:

a supporting board formed of an insulating material; and contact parts formed on said supporting board and connectable to solder bumps formed on a semiconductor device to be tested, wherein each of said contact parts comprises:

contact base layers formed of conductive materials other than solder; and a film-like solder layer covering said contact base layers, an upper surface of said film-like solder layer being below a level of an upper surface of said supporting board.

2. The semiconductor device test board as claimed in claim 1, wherein said supporting board is a glass/epoxy wiring board.

3. The semiconductor device test board as claimed in claim 1, wherein said solder layer has a thickness of 5–20 μm.

4. The semiconductor device test board as claimed in claim 1, further comprising, a solder resist part having a recessed shape provided at a predetermined position on said supporting board for receiving a non-testing solder bump provided on the semiconductor device, and said non-testing solder bump being insertable into said recessed shape and electrically unconnected in the test.

5. A method of testing a semiconductor device comprising the steps of:

a) mounting said semiconductor device on a semiconductor device test board by fusion connection of solder bumps provided on said semiconductor device to a solder layer in contact parts of said semiconductor device test board, said contact parts including contact base layers formed of conductive materials other than solder, said solder layer being film-like and covering the contact base layers, an upper surface of said solder layer being below a level of an upper surface of said test board;

b) performing a predetermined electrically driven test on said semiconductor device using said semiconductor device test board; and c) removing, after said step b), said semiconductor device from said semiconductor device test board by separating said solder bumps from said contact parts.

* * * * *